(12) United States Patent
Hashimoto et al.

(10) Patent No.: US 8,883,048 B2
(45) Date of Patent: Nov. 11, 2014

(54) REFLECTOR FOR LIGHT-EMITTING DEVICE, AND LIGHT-EMITTING DEVICE

(75) Inventors: Kazuhiko Hashimoto, Tokyo (JP);
Kazunori Terada, Tokyo (JP);
Masafumi Kuramoto, Tokushima (JP);
Motohisa Kitani, Tokushima (JP)

(73) Assignees: Asahi Kasei Chemicals Corporation, Tokyo (JP); Nichia Corporation, Tokushima (JP)

( * ) Notice: Subject to any disclaimer, the term of this patent is extended or adjusted under 35 U.S.C. 154(b) by 167 days.

(21) Appl. No.: 13/395,013

(22) PCT Filed: Sep. 7, 2010

(86) PCT No.: PCT/JP2010/065296
§ 371 (c)(1),
(2), (4) Date: May 17, 2012

(87) PCT Pub. No.: WO2011/030746
PCT Pub. Date: Mar. 17, 2011

(65) Prior Publication Data
US 2012/0228564 A1    Sep. 13, 2012

(30) Foreign Application Priority Data

Sep. 11, 2009    (JP) ................. P2009-210778

(51) Int. Cl.
| | | |
|---|---|---|
| F21V 9/00 | (2006.01) | |
| G02B 5/02 | (2006.01) | |
| G02C 7/10 | (2006.01) | |
| G02F 1/361 | (2006.01) | |
| G03B 11/00 | (2006.01) | |
| H01L 33/60 | (2010.01) | |
| C08K 5/3435 | (2006.01) | |
| F21V 7/00 | (2006.01) | |
| C08G 69/26 | (2006.01) | |
| C08K 3/22 | (2006.01) | |
| H01L 33/48 | (2010.01) | |

(52) U.S. Cl.
CPC ....... *C08G 69/26* (2013.01); *H01L 2224/73265* (2013.01); *H01L 2224/45144* (2013.01); *H01L 33/60* (2013.01); *H01L 2224/48465* (2013.01); *C08K 2003/2237* (2013.01); *C08K 5/3435* (2013.01); *H01L 2924/01322* (2013.01); *H01L 33/486* (2013.01); *H01L 2224/32245* (2013.01); *C08K 3/22* (2013.01); *H01L 2224/49107* (2013.01); *H01L 2224/48247* (2013.01)
USPC ...... 252/582; 362/296.02; 362/341; 524/606; 524/607; 528/323; 528/339; 528/346

(58) Field of Classification Search
USPC .............. 362/296.02, 341; 523/200; 524/126, 524/133, 447, 497, 514, 538, 606, 607; 525/66, 182, 420, 432; 528/310, 322, 528/323, 332, 335, 336, 340, 346, 339; 252/582
See application file for complete search history.

(56) References Cited

U.S. PATENT DOCUMENTS

| | | | |
|---|---|---|---|
| 2004/0034152 A1* | 2/2004 | Oka et al. ............... | 524/497 |
| 2004/0049006 A1* | 3/2004 | Aramaki et al. ......... | 528/335 |

(Continued)

FOREIGN PATENT DOCUMENTS

| | | |
|---|---|---|
| CN | 1477153 A | 2/2004 |
| EP | 2476731 | 7/2012 |

(Continued)

OTHER PUBLICATIONS

International Preliminary Report on Patentability and Written Opinion for International Application No. PCT/JP2010/065296, mail date is Apr. 19, 2012.

(Continued)

*Primary Examiner* — Bijan Ahvazi
(74) *Attorney, Agent, or Firm* — Greenblum & Bernstein, P.L.C.

(57) ABSTRACT

The present invention relates to a reflector for a light-emitting device consisting of (A) an polyamide composition comprising a polyamide polymerized from (a) a dicarboxylic acid comprising at least 50 mol % of an alicyclic dicarboxylic acid and (b) a diamine comprising at least 50 mol % of a diamine with a branched main chain.

13 Claims, 3 Drawing Sheets

(56) References Cited

U.S. PATENT DOCUMENTS

| | | |
|---|---|---|
| 2006/0293435 A1 | 12/2006 | Marens et al. |
| 2008/0260625 A1 * | 10/2008 | Kogoi et al. .................. 423/610 |
| 2011/0028614 A1 | 2/2011 | Shikano et al. |
| 2012/0170277 A1 | 7/2012 | Tamura et al. |

FOREIGN PATENT DOCUMENTS

| | | |
|---|---|---|
| JP | 62-179780 | 8/1987 |
| JP | 2004-75994 | 3/2004 |
| JP | 2005-194513 | 7/2005 |
| JP | 2007-294631 | 11/2007 |
| JP | 2008-544498 | 12/2008 |
| KR | 10-2004-0000326 | 1/2004 |
| WO | 2009/043849 | 4/2009 |

OTHER PUBLICATIONS

Search report from International Application No. PCT/JP2010/065296, mail date is Oct. 19, 2010.

Search report from E.P.O., mail date is Aug. 7, 2013.

* cited by examiner (a)

(b)

(c)

(d)

REFLECTOR FOR LIGHT-EMITTING DEVICE, AND LIGHT-EMITTING DEVICE

TECHNICAL FIELD

The present invention relates to a reflector for a light-emitting device, and a light-emitting device.

BACKGROUND ART

LEDs (light emission diodes) consume a very smaller amount of electricity, can emit light with higher luminance, and have a longer life than other light sources; for this reason, demand for the LEDs as lighting, display elements, and the like has been increased, and the LEDs are used in a variety of applications such as mobile communication terminals such as mobile phones, displays, dashboards for automobiles, and traffic lights. In such electrical and electric devices, the weight and thickness have been reduced, and the SMT (surface mount technology) is applied.

For this reason, for the resin material used for these applications of the LED, enough heat resistance to endure a solder reflow process at a high temperature, durability in an operating environment (temperature and light) of an LED assembly, fluidity for producing a light, thick part, and the like are needed.

Generally, examples of the material that satisfies such performance include heat-resistant polyamides. It is disclosed in Patent Literature 1 that a composition comprising polyamide 9T and titanium oxide, in which change in color tone by heat and at the time of irradiation with ultraviolet rays is small, and soldering heat resistance is improved. Patent Literature 2 discloses a reflector for an light emitting diode element comprising a composition comprising a polyamide having terephthalic acid units, a white pigment, and an inorganic filling material in which a flexural modulus at 130° C. is 4500 MPa to 12000 MPa; Patent Literature 3 discloses a light emitting diode assembly housing comprising a composition comprising a polyamide having terephthalic acid units in which the melting point is not less than 270° C., titanium dioxide, an inorganic reinforcing material, and an oxidation stabilizer.

CITATION LIST

Patent Literature

Patent Literature 1: Japanese Patent Application Laid-Open Publication No. 2004-75994
Patent Literature 2: Japanese Patent Application Laid-Open Publication No. 2005-194513
Patent Literature 3: Japanese Unexamined Patent Application Publication No. 2008-544498

SUMMARY OF INVENTION

Technical Problem

While the conventional polyamide comprising terephthalic acid units as a principal component is surely excellent from the viewpoint of soldering heat resistance, it cannot be said that it is not necessarily sufficient from the viewpoint of fluidity, resistance against thermal color change, resistance against optical color change, and rate-limitation of the life of the LED and luminance due to deterioration of a reflector comprising a polyamide may reduce.

An object of the present invention is to provide a reflector for a light-emitting device having a longer life and a light-emitting device including the reflector for a light-emitting device.

Solution to Problem

As a result of extensive examination in order to solve the above problems, the present inventors have found out that a reflector for a light-emitting device comprising a polyamide composition consisting of a polyamide polymerized from a dicarboxylic acid comprising at least 50 mol % of alicyclic dicarboxylic acid and a diamine comprising at least 50 mol % of a diamine with a branched main chain, and a light-emitting device using the reflector can solve the above problems, and completed the present invention.

Namely, the present invention is as follows.

[1] A reflector for a light-emitting device consisting of (A) a polyamide composition comprising a polyamide polymerized from (a) a dicarboxylic acid comprising at least 50 mol % of an alicyclic dicarboxylic acid and (b) a diamine comprising at least 50 mol % of diamine with a branched main chain.

[2] The reflector for a light-emitting device according to [1], wherein the diamine with a branched main chain is 2-methylpentamethylenediamine.

[3] The reflector for a light-emitting device according to [1] or [2], wherein the alicyclic dicarboxylic acid is 1,4-cyclohexanedicarboxylic acid.

[4] The reflector for a light-emitting device according to any one of [1] to [3], wherein a melting point of (A) the polyamide is 270 to 350° C.

[5] The reflector for a light-emitting device according to any one of [1] to [4], wherein a ratio of a trans isomer in (A) the polyamide is 50 to 85%.

[6] The reflector for a light-emitting device according to any one of [1] to [5], wherein the polyamide composition further comprises (B) a white pigment.

[7] The reflector for a light-emitting device according to [6], wherein (B) the white pigment comprises titanium oxide having a number average particle diameter of 0.1 to 0.8 μm (by electron microscopy).

[8] The reflector for a light-emitting device according to [7], wherein (B) the titanium oxide is subjected to inorganic coating and/or organic coating.

[9] The reflector for a light-emitting device according to [7] or [8], wherein an ignition loss of (B) the titanium oxide is 0.7 to 2.5% by mass.

[10] The reflector for a light-emitting device according to any one of [1] to [9], wherein the polyamide composition further comprises (C) an amine light stabilizer.

[11] The reflector for a light-emitting device according to any one of [1] to [10], wherein the polyamide composition further comprises (D) a phenol heat stabilizer.

[12] The reflector for a light-emitting device according to any one of [1] to [11], wherein the polyamide composition further comprises one or more inorganic fillers selected from the group consisting of (E) glass fibers, potassium titanate fibers, talc, wollastonite, kaolin, mica, calcium carbonate, and clay.

[13] A reflector for a light-emitting device comprising a polyamide composition comprising:
(A) 55 to 95% by mass of a polyamide polymerized from (a) a dicarboxylic acid comprising at least 50 mol % of an alicyclic dicarboxylic acid and (b) a diamine comprising at least 50 mol % of a diamine with a branched main chain,
(B) 5 to 45% by mass of titanium oxide,
(C) 0 to 1% by mass of an amine light stabilizer, (D) 0 to 1% by mass of a phenol heat stabilizer, and
(E) 0 to 25% by mass of an inorganic filling material
based on the whole mass (based on 100 mass % the polyamide compositions).

[14] A light-emitting device comprising the reflector for a light-emitting device according to any one of [1] to [13].

Advantageous Effect of Invention

According to the present invention, a reflector for a light-emitting device having a longer life and a light-emitting device including the reflector for a light-emitting device can be provided.

DESCRIPTION OF EMBODIMENTS

Figure 1:
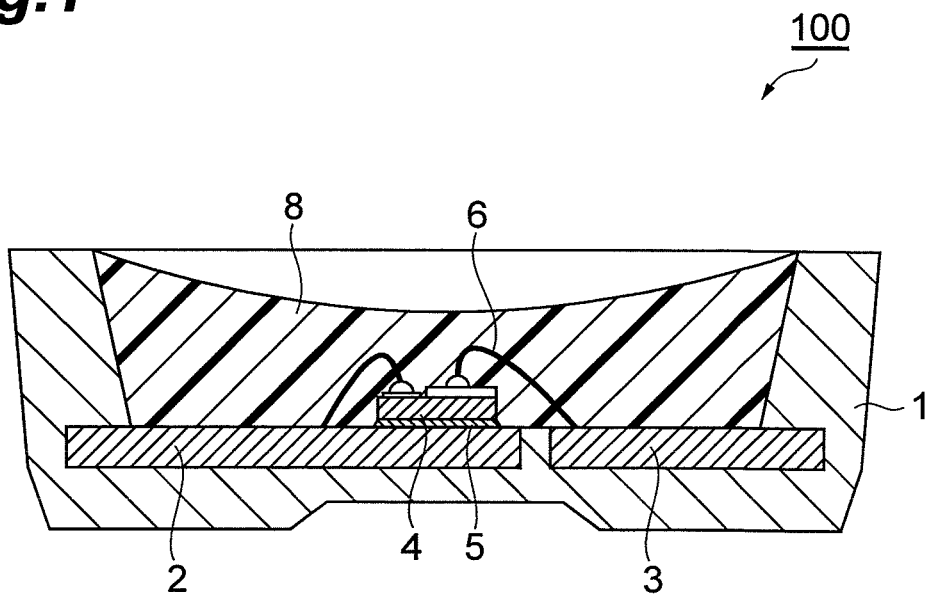
FIG. 1 is a schematic sectional view of a light-emitting device according to an embodiment.

Hereinafter, embodiments for implementing the present invention (hereinafter, referred to as "the present embodiment.") will be described in detail. Note that the present invention will not be limited to embodiments below, and can be modified in various ways within the scope of the grits and implemented.

A reflector for a light-emitting device according to the present embodiment consists of a polyamide polymerized from a dicarboxylic acid comprising an alicyclic dicarboxylic acid and a diamine comprising a diamine with a branched main chain, and a light-emitting device according to the present embodiment includes the reflector for a light-emitting device.

[(A) Polyamide]
An (A) polyamide used in the present embodiment is a polyamide polymerized from (a) and (b) below:
(a) a dicarboxylic acid comprising at least 50 mol % of an alicyclic dicarboxylic acid, and
(b) a diamine comprising at least 50 mol % of a diamine with a branched main chain (referred to as a diamine having a structure in which a chain between two amines is not a liner structure, but has a side chain).

In the present embodiment, polyamide means a polymer having an amide (—NHCO—) bond in the main chain.

(a) Dicarboxylic Acid
(a) a dicarboxylic acid used in the present embodiment comprises at least 50 mol % of an alicyclic dicarboxylic acid (based on the total number of moles of dicarboxylic acids); because mol % of the alicyclic dicarboxylic acid is the above value, a polyamide that can simultaneously satisfy heat resistance, fluidity, toughness, low moisture absorbing properties, rigidity, and the like can be obtained.

Examples of (a-1) an alicyclic dicarboxylic acid (also written as an alicyclic dicarboxylic acid) include alicyclic dicarboxylic acids in which carbon atoms of an alicyclic structure are 3 to 10, preferably 5 to 10, such as 1,4-cyclohexanedicarboxylic acid, 1,3-cyclohexanedicarboxylic acid, and 1,3-cyclopentanedicarboxylic acid.

The alicyclic dicarboxylic acid may not be substituted, or may have a substituent. Examples of the substituent include alkyl groups having 1 to 4 carbon atoms such as a methyl group, an ethyl group, an n-propyl group, an isopropyl group, an n-butyl group, an isobutyl group, and a tert-butyl group.

From the viewpoint of heat resistance, low moisture absorbing properties, rigidity, and the like, it is preferable that the alicyclic dicarboxylic acid be 1,4-cyclohexanedicarboxylic acid.

One of the alicyclic dicarboxylic acids may be used, or two or more thereof may be used in combination.

In the alicyclic dicarboxylic acids, geometric isomers of a trans isomer and a cis isomer exist. As the alicyclic dicarboxylic acid as a raw material monomer, one of the trans isomer and the cis isomer may be used, or a mixture of a trans isomer and a cis isomer in a variety of ratios may be used.

In the alicyclic dicarboxylic acid, a constant ratio is obtained by isomerization at a high temperature, and in the cis isomer, water solubility of an equivalent salt with the diamine is higher than that of the trans isomer; accordingly, as the raw material monomer, the trans isomer/cis isomer ratio is preferably 50/50 to 0/100, more preferably 40/60 to 10/90, and still more preferably 35/65 to 15/85 in a molar ratio.

The trans isomer/cis isomer ratio (molar ratio) of the alicyclic dicarboxylic acid can be determined by the liquid chromatography (HPLC) or nuclear magnetic resonance spectroscopy (NMR).

Examples of (a-2) a dicarboxylic acid other than the alicyclic dicarboxylic acid in (a) the dicarboxylic acid used in the present embodiment include aliphatic dicarboxylic acids and aromatic dicarboxylic acids.

Examples of the aliphatic dicarboxylic acid include linear or branched saturated aliphatic dicarboxylic acids having 3 to 20 carbon atoms such as malonic acid, dimethylmalonic acid, succinic acid, 2,2-dimethylsuccinic acid, 2,3-dimethylglutaric acid, 2,2-diethylsuccinic acid, 2,3-diethylglutaric acid, glutaric acid, 2,2-dimethylglutaric acid, adipic acid, 2-methyladipic acid, trimethyladipic acid, pimelic acid, suberic acid, azelaic acid, sebacic acid, dodecanedioic acid, tetradecanedioic acid, hexadecanedioic acid, octadecanedioic acid, eicosandioic acid, and diglycolic acid.

Examples of the aromatic dicarboxylic acid include aromatic dicarboxylic acid having 8 to 20 carbon atoms not substituted or substituted by a variety of substituents such as terephthalic acid, isophthalic acid, naphthalenedicarboxylic acid, 2-chloroterephthalic acid, 2-methylterephthalic acid, 5-methylisophthalic acid, and 5-sodiumsulfoisophthalic acid.

Examples of a variety of substituents include an alkyl group having 1 to 4 carbon atoms, an aryl group having 6 to 10 carbon atoms, an arylalkyl group having 7 to 10 carbon atoms, halogen groups such as a chloro group and a bromo group, a silyl group having 1 to 6 carbon atoms, and a sulfonate group and salts thereof (sodium salts and the like).

In the case where the dicarboxylic acid other than the alicyclic dicarboxylic acid is copolymerized, from the viewpoint of heat resistance, fluidity, toughness, low moisture absorbing properties, rigidity, and the like, aliphatic dicarboxylic acids are preferably used, and more preferably, aliphatic dicarboxylic acids having 6 or more carbon atoms are used.

Among these, preferred are aliphatic dicarboxylic acid having 10 or more carbon atoms from the viewpoint of heat resistance, low moisture absorbing properties, and the like. Examples of the aliphatic dicarboxylic acid having 10 or more carbon atoms include sebacic acid, dodecanedioic acid, tetradecanedioic acid, hexadecanedioic acid, octadecanedioic acid, and eicosandioic acid. Among these, preferred are sebacic acid and dodecanedioic acid from the viewpoint of heat resistance and the like.

One of the dicarboxylic acids other than the alicyclic dicarboxylic acid may be used, or two or more thereof may be used in combination.

The proportion of (a-1) the alicyclic dicarboxylic acid in the (a) dicarboxylic acid (mol %) is at least 50 mol %. The proportion of the alicyclic dicarboxylic acid is 50 to 100 mol %, preferably 60 to 100 mol %, more preferably 70 to 100 mol %, and still more preferably 100 mol %. Because the proportion of the alicyclic dicarboxylic acid is at least 50 mol %, the polyamide whose heat resistance, low moisture absorbing properties, rigidity, and the like are excellent can be obtained.

The proportion of (a-2) the arboxylic acid other than the alicyclic dicarboxylic acid in (a) the dicarboxylic acid (mol %) is 0 to 50 mol %, and preferably 0 to 40 mol %.

In the case where the aliphatic dicarboxylic acid having 10 or more carbon atoms is comprised as (a) the dicarboxylic acid component, preferably, (a-1) the alicyclic dicarboxylic acid is 50 to 99.9 mol % and (a-2) the aliphatic dicarboxylic acid having 10 or more carbon atoms is 0.1 to 50 mol %, more preferably, (a-1) the alicyclic dicarboxylic acid is 60 to 95 mol % and (a-2) the aliphatic dicarboxylic acid having 10 or more carbon atoms is 5 to 40 mol %, and still more preferably, (a-1) the alicyclic dicarboxylic acid is 80 to 95 mol % and (a-2) the aliphatic dicarboxylic acid having 10 or more carbon atoms is 5 to 20 mol %.

(b) Diamine (b) The diamine used in the present embodiment comprises at least 50 mol % (based on the total number of moles of diamines) of diamine with a branched main chain (diamine having a substituent branched from the main chain).

Because (b) the diamine comprises at least 50 mol % of a diamine with a branched main chain a polyamide that can simultaneously satisfy fluidity, toughness, rigidity, and the like can be obtained.

Examples of the substituent branched from the main chain include an alkyl group having 1 to 4 carbon atoms such as a methyl group, an ethyl group, an n-propyl group, an isopropyl group, an n-butyl group, an isobutyl group, and a tert-butyl group.

Examples of (b-1) the diamine with a branched main chain include branched saturated aliphatic diamine having 3 to 20 carbon atoms such as 2-methylpentamethylenediamine (also written as 2-methyl-1,5-diaminopentane), 2,2,4-trimethylhexamethylenediamine, 2,4,4-trimethylhexamethylenediamine, 2-methyloctamethylenediamine, and 2,4-dimethyloctamethylenediamine.

As the diamine with a branched main chain, preferred is 2-methylpentamethylenediamine from the viewpoint of heat resistance, rigidity, and the like. One of the diamines with a branched main chain may be used, or two or more thereof may be used in combination.

Examples of (b-2) diamines other, than the diamine with a branched main chain in (b) the diamines used in the present embodiment include aliphatic diamines, alicyclic diamines, and aromatic diamines.

Examples of the aliphatic diamines include linear saturated aliphatic diamines having 2 to 20 carbon atoms such as ethylenediamine, propylenediamine, tetramethylenediamine, pentamethylenediamine, hexamethylenediamine, heptamethylenediamine, octamethylenediamine, nonamethylenediamine, decamethylenediamine, undecamethylenediamine, dodecamethylenediamine, and tridecamethylenediamine.

Examples of the alicyclic diamines (also written as alicyclic diamines) include 1,4-cyclohexanediamine, 1,3-cyclohexanediamine, and 1,3-cyclopentanediamine.

Examples of the aromatic diamines include diamine compounds such as metaxylylenediamine.

From the viewpoint of heat resistance, fluidity, toughness, low moisture absorbing properties, rigidity, and the like, the diamine other than the diamine with a branched main chain is preferably aliphatic diamines and alicyclic diamines, more preferably linear saturated aliphatic diamines having 4 to 13 carbon atoms, still more preferably linear saturated aliphatic diamines having 6 to 10 carbon atoms, and still further more preferably hexamethylenediamine. One of the diamines other than the diamine with a branched main chain may be used, or two or more thereof may be used in combination.

The proportion of (b-1) the diamine with a branched main chain in (b) the diamine (mol %) is at least 50 mol %. Namely, the proportion of the diamine with a branched main chain is 50 to 100 mol %, and preferably 60 to 100 mol %. More preferably, the proportion is 80 to 100 mol %, still more preferably, 85 to 100 mol %, particularly preferably 90 to 100 mol %, and most preferably 100 mol %. Because the proportion of the diamine with a branched main chain is at least 50 mol %, the polyamide whose fluidity, toughness, and rigidity are high can be obtained.

The proportion of (b-2) the diamine other than the diamine with a branched main chain is at least 50 mol % in (b) the diamine (mol %) is 0 to 50 mol %, and preferably 0 to 40 mol %.

It is preferable that the amount of (a) the dicarboxylic acid to be added and the amount of (b) the diamine to be added be close to the same molar amount. Considering the (b) diamine that escapes to the outside of the reaction system during the polymerization reaction in the molar ratio, the molar amount of the (b) diamine as a whole is preferably 0.9 to 1.2, more preferably 0.95 to 1.1, and still more preferably 0.98 to 1.05 based on the molar amount of the (a) dicarboxylic acid as a whole of 1.

(c) Lactam and/or Aminocarboxylic Acid

From the viewpoint of toughness, (A) the polyamide can be further copolymerized with (c) lactam and/or aminocarboxylic acid. Note that the (c) lactam and/or aminocarboxylic acid used in the present embodiment means polymerizable (polycondensable) lactam and/or aminocarboxylic acid.

In the case where (A) the polyamide is a polyamide polymerized from (a) the dicarboxylic acid, (b) the diamine, and (c) the lactam and/or aminocarboxylic acid are polymerized, as (c) the lactam and/or aminocarboxylic acid, lactam and/or aminocarboxylic acid having 4 to 14 carbon atoms is preferable, and it is more preferable to use lactam and/or aminocarboxylic acid having 6 to 12 carbon atoms.

Examples of lactam include butyrolactam, pivalolactam, ε-caprolactam, caprylolactam, enantholactam, undecanolactam, and laurolactam (dodecanolactam). Among these, from the viewpoint of toughness, ε-caprolactam, laurolactam, and the like are preferable, and ε-caprolactam is more preferable.

Examples of aminocarboxylic acid include compounds in which the lactam is ring-opened, such as ω-aminocarboxylic acid and α,ω-amino acid.

The aminocarboxylic acid is preferably linear or branched saturated aliphatic carboxylic acids having 4 to 14 carbon atoms in which the ω-position is substituted by an amino group, and examples thereof include 6-aminocaproic acid, 11-aminoundecanoic acid, and 12-aminododecanoic acid; examples of aminocarboxylic acid also include paraminomethylbenzoic acid.

One of the lactams and/or aminocarboxylic acids may be used, or two or more thereof may be used in combination.

The amount of (c) the lactam and/or aminocarboxylic acid to be added (mol %) is preferably 0 to 20 mol % based on the whole molar amount of the monomers (a), (b), and (c).

When a polyamide is polymerized from (a) the dicarboxylic acid and (b) the diamine, a known end-capping agent can be further added in order to adjust the molecular weight.

Examples of the end-capping agent include monocarboxylic acids, monoamines, acid anhydrides such as phthalic anhydrides, monoisocyanates, monoacid halides, monoesters, and monoalcohols; from the viewpoint of thermal stability, monocarboxylic acids and monoamines are preferred. One of the end-capping agents may be used, or two or more thereof may be used in combination.

The monocarboxylic acid that can be used as the end-capping agent is not particularly limited as long as it has a reactivity with an amino group, and examples thereof include aliphatic monocarboxylic acids such as formic acid, acetic acid, propionic acid, butyric acid, valeric acid, caproic acid, caprylic acid, lauric acid, tridecylic acid, myristic acid, palmitic acid, stearic acid, pivalic acid, and isobutyric acid; alicyclic monocarboxylic acids such as cyclohexanecarboxylic acid; and aromatic monocarboxylic acids such as benzoic acid, toluic acid, α-naphthalenecarboxylic acid, β-naphthalenecarboxylic acid, methylnaphthalenecarboxylic acid, and phenylacetic acid. One of the monocarboxylic acids may be used, or two or more thereof may be used in combination.

The monoamines that can be used as the end-capping agent is not particularly limited as long as it has a reactivity with a carboxyl group, and examples thereof include aliphatic monoamines such as methylamine, ethylamine, propylamine, butylamine, hexylamine, octylamine, decylamine, stearylamine, dimethylamine, diethylamine, dipropylamine, and dibutylamine; alicyclic monoamines such as cyclohexylamine and dicyclohexylamine; and aromatic monoamines such as aniline, toluidine, diphenylamine, and naphthylamine. One of the monoamines may be used, or two or more thereof may be used in combination.

While the combination of (a) the dicarboxylic acid and (b) the diamine is not limited to the following, a combination of (a-1) at least not less than 50 mol % of the alicyclic dicarboxylic acid and (b-1) at least not less than 50 mol % of 2-methylpentamethylenediamine is preferable, and (a-1) at least not less than 50 mol % of 1,4-cyclohexanedicarboxylic acid and (b-1) at least not less than 50 mol % of 2-methylpentamethylenediamine are more preferable.

If these combinations of the components are polymerized as the component of the polyamide, a polyamide that can simultaneously satisfy high heat resistance, fluidity, toughness, low moisture absorbing properties, and rigidity can be obtained.

In (A) the polyamide, an alicyclic dicarboxylic acid structure exists as geometric isomers of a trans isomer and a cis isomer.

The ratio of the trans isomer in the alicyclic dicarboxylic acid structure in the polyamide represents a ratio of the trans isomer in the whole alicyclic dicarboxylic acid in the polyamide, and the ratio of the trans isomer is preferably 50 to 85 mol %, more preferably 50 to 80 mol %, and still more preferably 60 to 80 mol %.

As (a-1) the alicyclic dicarboxylic acid, the alicyclic dicarboxylic acid in which the trans isomer/cis isomer ratio (molar ratio) is 50/50 to 0/100 is preferably used; as the polyamide obtained by polymerization of (a) the dicarboxylic acid with (b) the diamine, the ratio of the trans isomer is preferably 50 to 85 mol %.

If the ratio of the trans isomer is within the range above, in addition to the features of a high melting point, and excellent toughness and rigidity, the polyamide has properties in which rigidity during heating due to a high Tg, fluidity that is usually contradictory to the heat resistance, and high crystallinity are simultaneously satisfied.

These features of the polyamide are particularly remarkable in a polyamide consisting of a combination of (a) at least not less than 50 mol % of 1,4-cyclohexanedicarboxylic acid and (b) at least not less than 50 mol % of 2-methylpentamethylenediamine in which the ratio of the trans isomer is 50 to 85 mol %.

In the present embodiment, the ratio of the trans isomer can be measured by the method according to Examples below.

(A) The polyamide is not particularly limited, and can be produced by a method for producing a polyamide comprising the step of polymerizing (a) the dicarboxylic acid comprising at least 50 mol % of the alicyclic dicarboxylic acid with (b) the diamine comprising at least 50 mol % of the aliphatic diamine with a branched main chain is at least 50 mol %.

It is preferable that the method for producing (A) the polyamide further comprise a step of increasing the degree of polymerization of the polyamide.

Examples of the method for producing a polyamide include a variety of methods as exemplified below.

1) a method of heating an aqueous solution or aqueous suspension of a diamine dicarboxylic acid salt or a mixture thereof, and performing polymerization while the molten state is kept (hereinafter, sometimes abbreviated to a "thermal melt polymerization method"), 2) a method of increasing the degree of polymerization while the polyamide obtained by the thermal melt polymerization method is kept in a solid state at a temperature not more than the melting point (hereinafter, sometimes abbreviated to a "thermal melt polymerization and solid phase polymerization method"), 3) a method of heating an aqueous solution or aqueous suspension of a diamine dicarboxylic acid salt or a mixture thereof, and further melting the deposited prepolymer by an extruder such as a kneader to increase the degree of polymerization (hereinafter, sometimes abbreviated to a "prepolymer extrusion polymerization method"), 4) a method of heating an aqueous solution or aqueous suspension of a diamine dicarboxylic acid salt or a mixture thereof, and further increasing the degree of polymerization while the deposited prepolymer is kept in a solid state at a temperature not more than the melting point of the polyamide (hereinafter, sometimes abbreviated to a "prepolymer solid phase polymerization method"), 5) a method of performing polymerization while a diamine dicarboxylic acid salt or a mixture thereof is kept in a solid state (hereinafter, sometimes abbreviated to a "solid phase polymerization method"), and 6) a "solution method," i.e., a method of performing polymerization using a dicarboxylic acid halide component equivalent to a dicarboxylic acid and a diamine component.

As the molecular weight of (A) the polyamide in the present embodiment, the relative viscosity $\eta r$ at 25° C. can be used as an index.

From the viewpoint of mechanical physical properties such as toughness and rigidity and moldability, as the molecular weight of (A) the polyamide in the present embodiment, the relative viscosity $\eta r$ at a concentration of 1% in 98% sulfuric acid measured according to JIS-K6810 and at 25° C. is preferably 1.5 to 7.0, more preferably 1.7 to 6.0, and still more preferably 1.9 to 5.5.

The measurement of the relative viscosity at 25° C. can be performed according to JIS-K6810 as described in Examples below.

From the viewpoint of heat resistance, the melting point of the (A) polyamide in the present embodiment described as Tm2 in detail below is preferably 270 to 350° C. Moreover, the melting point Tm2 is preferably not less than 270° C., more preferably not less than 275° C., and still more preferably not less than 280° C. The melting point Tm2 is preferably not more than 350° C., more preferably not more than 340° C., still more preferably not more than 335° C., and still further more preferably not more than 330° C.

If the melting point Tm2 of (A) the polyamide is not less than 270° C., a polyamide whose heat resistance is high can be obtained. Moreover, if the melting point Tm2 of (A) the polyamide is not more than 350° C., thermal degradation of the polyamide in melt processing such as extrusion and molding, and the like can be suppressed.

From the viewpoint of heat resistance, the amount of heat of fusion ΔH of (A) the polyamide in the present embodiment is preferably not less than 10 J/g, more preferably not less than 14 J/g, still more preferably not less than 18 J/g, and still further more preferably not less than 20 J/g.

The measurement of the melting point (Tm1 or Tm2 described in detail below) and the amount of heat of fusion ΔH of (A) the polyamide in the present embodiment can be performed according to JIS-K7121 as described in Examples below.

Examples of a measuring apparatus for the melting point and the amount of heat of fusion include a Diamond-DSC made by PERKIN-ELMER Inc.

The glass transition temperature Tg of (A) the polyamide in the present embodiment is preferably 90 to 170° C. The glass transition temperature is preferably not less than 90° C., more preferably not less than 100° C., and still more preferably not less than 110° C. Moreover, the glass transition temperature is preferably not more than 170° C., more preferably not more than 165° C., and still more preferably not more than 160° C.

If the glass transition temperature of (A) the polyamide is not less than 90° C., a polyamide whose heat resistance and resistance against chemicals are high can be obtained. Moreover, if the glass transition temperature of (A) the polyamide is not more than 170° C., a molded product having a good appearance can be obtained.

The measurement of the glass transition temperature can be performed according to JIS-K7121 as described in Examples below.

Examples of a measurement apparatus for the glass transition temperature include a Diamond-DSC made by PERKIN-ELMER Inc.

In the present embodiment, in order to enhance reflectance in a visible light region, (B) a white pigment may be further comprised.

[(B) White Pigment]

As (B) the white pigment, known white pigments can be used, and examples thereof include titanium oxide, zinc oxide, zinc sulfide, lead white, zinc sulfate, barium sulfate, and aluminum oxide. Among these, preferred is titanium oxide. One of these white pigments may be used, or two or more thereof may be used in combination.

Examples of titanium oxide include titanium oxide (TiO), dititanium trioxide ($Ti_2O_3$), and titanium dioxide ($TiO_2$). Among these, preferred is titanium dioxide.

The crystal structure of these titanium oxides is not particularly limited, and is preferably a rutile type from the viewpoint of optical resistance.

From the viewpoint of toughness and extrusion processability, the number average particle diameter of titanium oxide is preferably 0.1 to 0.8 μm, more preferably 0.15 to 0.4 μm, and still more preferably 0.15 to 0.3 μm.

The number average particle diameter of these titanium oxides can be measured by electron microscopic photographing. For example, a polyamide resin composition is placed in an electric furnace to burn the comprised organic substance; from the residue, for example, 100 or more titanium oxides are arbitrarily selected, and observed by an electron microscope to measure these particle sizes; thereby, the number average particle diameter can be measured and determined.

Titanium oxide may be obtained by the so-called sulfuric acid method of hydrolyzing a titanium sulfate solution, or the so-called chlorine method of performing gaseous phase oxidation of halogenated titanium, for example, and the method is not particularly limited.

Preferably, the surface of a titanium oxide particle is coated. More preferably, the surface of a titanium oxide particle is coated with an inorganic coating first, and with an organic coating applied on the inorganic coating next. The titanium oxide particle may be coated by any known method in the art.

Preferably, the inorganic coating comprises a metal oxide. Examples of the inorganic coating include metal oxides and hydrated oxides comprising oxides of silicon, aluminum, zirconium, phosphorus, zinc, rare earth elements, and the like and hydrated oxides thereof. Among these, preferable metal oxides are silica, alumina, and zirconia from the viewpoint of optical resistance, and more preferable are silica and alumina. These inorganic coatings may be one of the metal oxides, or a combination of two or more thereof.

Preferably, the organic coating comprises one or a plurality of carboxylic acids, polyols, alkanolamines, and/or silicon compounds. Among these, polyols and silicon compounds are more preferable from the viewpoint of optical resistance and film processability, and silicon compounds are still more preferable from the viewpoint of reduction in gas produced during processing. Examples of the silicon compounds that can be used for the organic coating in the present invention include organosilanes, organopolysiloxanes, organosilazanes, and among these, organopolysiloxanes are preferred.

The ignition loss of titanium oxide is not particularly limited, and preferably in the range of 0.7 to 2.5% by mass based on 100% by mass of the whole titanium oxide from the viewpoint of extrusion processability. More preferably, the ignition loss is 0.7 to 2.0% by mass, and still more preferably 0.8 to 1.5% by mass. Here, the ignition loss can be calculated by the percentage of weight loss when titanium oxide is dried at 120° C. for 4 hours to remove moisture adhering to the surface thereof, and heat treated at 650° C. for 2 hours.

Note that one of these titanium oxides may be used, or two or more thereof may be used in combination.

As the amounts of (A) the polyamide and (B) the titanium oxide to be blended, preferably, (A) the polyamide is 55 to 95% by mass and (B) the titanium oxide is 5 to 45% by mass from the viewpoint of whiteness, and more preferably, (A) the polyamide is 65 to 85% by mass and (B) the titanium oxide is 15 to 35% by mass based on 100% by mass of the polyamide composition.

In the present embodiment, from the viewpoint of optical stability, (C) the amine light stabilizer may be further comprised.

[(C) Amine Light Stabilizer]

The amine light stabilizer is not particularly limited, and known amine light stabilizers can be used. Among these, preferable are bis(2,2,6,6-tetramethyl-4-piperidyl)carbonate, bis(2,2,6,6-tetramethyl-4-piperidyl)oxalate, bis(2,2,6,6-tetramethyl-4-piperidyl)malonate, bis(2,2,6,6-tetramethyl-4-piperidyl)sebacate, bis(2,2,6,6-tetramethyl-4-piperidyl)adipate, bis(2,2,6,6-tetramethyl-4-piperidyl)terephthalate, N,N'-bis-2,2,6,6-tetramethyl-4-piperidinyl-1,3-benzenedicarboxyamide, tetrakis(2,2,6,6-tetramethyl-4-piperidyl)-1,2,3,4-butanetetracarboxylate; more preferable are bis(2,2,6,6-tetramethyl-4-piperidyl)sebacate, N,N'-bis-2,2,6,6-tetramethyl-4-piperidinyl-1,3-benzenedicarboxyamide, tetrakis(2,2,6,6-tetramethyl-4-piperidyl)-1,2,3,4-butanetetracarboxylate; and still more preferable are N,N'-bis-2,2,6,6-tetramethyl-4-piperidinyl-1,3-benzenedicarboxyamide.

These amine light stabilizers are preferably a low molecular type having a molecular weight less than 1,000 from the viewpoint of further improving optical stability. If the polymer type is that having the molecular weight of not less than 1,000, it is necessary to increase the amount of the amine light stabilizer to be added in order to achieve equivalent optical stability, and the amount of gas to be produced may be increased.

The amount of the amine light stabilizer to be blended in the polyamide composition is preferably 0 to 1% by mass, more preferably 0.01 to 1% by mass, and still more preferably 0.1 to 1% by mass based on 100% by mass of the polyamide composition. At an amount within the range above, the optical stability can be further improved.

In the present embodiment, from the viewpoint of thermal stability, (D) a phenol heat stabilizer may be further comprised.

[(D) Phenol Heat Stabilizer]

The phenol heat stabilizer is not particularly limited, and known phenol heat stabilizers can be used. Examples thereof include N,N'-hexane-1,6-diylbis-[3-(3,5-di-t-butyl-4-hydroxyphenylpropionamide), pentaerythrityl-tetrakis[3-(3,5-di-t-butyl-4-hydroxyphenyl)propionate], N,N'-hexamethylenebis(3,5-di-t-butyl-4-hydroxy-hydrocinnamamide), triethylene glycol-bis[3-(3-t-butyl-5-methyl-4-hydroxyphenyl)propionate], 3,9-bis{2[3-(3-t-butyl-4-hydroxy-5-methylphenyl)propynyloxy]-1,1-dimethylethyl}-2,4,8,10-tetraoxaspiro[5,5]undecane, 3,5-di-t-butyl-4-hydroxybenzylphosphonate-diethylester, 1,3,5-trimethyl-2,4,6-tris(3,5-di-t-butyl-4-hydroxybenzyl)benzene, and 1,3,5-tris(4-t-butyl-3-hydroxy-2,6-dimethylbenzyl)isocyanurate; among these, preferable is N,N'-hexane-1,6-diylbis[3-(3,5-di-t-butyl-4-hydroxyphenylpropionamid e)] from the viewpoint of further improving the thermal stability.

The amount of the phenol heat stabilizer to be blended in the polyamide composition is preferably 0 to 1% by mass, more preferably 0.01 to 1% by mass, and still more preferably 0.1 to 1% by mass based on 100% by mass of the polyamide composition. At an amount within the range above, the thermal stability can be further improved.

In the present embodiment, from the viewpoint of mechanical physical properties such as strength and rigidity, (E) an inorganic filling material may be further comprised.

[(E) Inorganic Filling Material]

The (E) inorganic filling material is not particularly limited, and examples thereof include glass fibers, potassium titanate fibers, talc, wollastonite, kaolin, mica, calcium carbonate, and clay.

Among the glass fibers, from the viewpoint of an ability to give high mechanical strength properties, those in which the number average fiber diameter is 3 to 30 μm, and in the resin composition, the weight average fiber length is 100 to 750 μm, and the aspect ratio (L/D) of the weight average fiber length to the number average fiber diameter is 10 to 100 are more preferably used.

Here, the number average fiber diameter and weight average fiber length in this specification are determined by a method as follows: for example, the resin composition is placed into an electric furnace to burn the comprised organic substance; from the residue, for example, 100 or more glass fibers are arbitrarily selected, and observed by the SEM to measure the fiber diameters of these glass fibers; thereby, the number average fiber diameter is measured; using an SEM photograph at a magnification of 1000 times, the fiber length is measured to determine the weight average fiber length.

Moreover, the inorganic filling material may be surface treated with a silane coupling agent or the like. The silane coupling agent is not particularly limited, and examples thereof include amino silanes such as γ-aminopropyltriethoxysilane, γ-aminopropyltrimethoxysilane, and N-β-(aminoethyl)-γ-aminopropylmethyldimethoxysilane; mercaptosilanes such as γ-mercaptopropyltrimethoxysilane and γ-mercaptopropyltriethoxysilane; epoxysilanes; and vinylsilanes. Among these, preferable is one or more selected from the components listed above, and more preferable are amino silanes.

The amount of the inorganic filling material to be blended in the polyamide composition is preferably 0 to 25% by mass, more preferably 1 to 25% by mass, and still more preferably 2 to 20% by mass based on 100% by mass of the polyamide composition. At an amount within the range above, strength, rigidity, and toughness as the composition can be kept in balance, and defects in the production step of the reflector for a light-emitting device can be reduced.

[Other Components that can be Comprised in Polyamide Composition]

Other than the components above, other components may be further added when necessary in a range in which the effect of the present embodiment is not impaired.

The other components are not limited to the following; for example, a coloring agent such as pigments and dyes (including coloring masterbatches), a mold release agent, a flame retardant, a fibrillation agent, a lubricant, a fluorescent brightener, a plasticizer, a copper compound, a halogenated alkali metal compound, an antioxidant, a stabilizer, an ultraviolet absorbing agent, an antistatic agent, a fluidity improver, a filler, a reinforcing agent, a spreading agent, a nucleator, rubbers, a strengthening agent, and other polymers may be mixed. Here, because in the other components above, the properties are significantly different from each other, a suitable content of each of the respective components such that the effect of the present embodiment is hardly impaired is varied. Moreover, persons skilled in the art could easily set the suitable content for each of the other components above.

A method for producing a polyamide composition in the present embodiment is not particularly limited as long as it is a method of mixing the above (A) polyamide and the other components.

Examples of a method for mixing the polyamide and the other components include a method for mixing the polyamide and the other components using a tumbler, a Henschel mixer, or the like, feeding the mixture to a melt kneading machine to knead the mixture; and a method for blending other components from a side feeder to polyamide molten by a single-screw or twin-screw extruder.

The melt kneading temperature is preferably approximately 250 to 375° as a temperature of the resin, and the melt kneading time is preferably approximately 0.25 to 5 minutes.

An apparatus that performs melt kneading is not particularly limited, and known apparatuses such as melt kneading machines such as a single-screw or twin-screw extruder, a Banbury mixer, and a mixing roll can be used.

In the reflector for a light-emitting device according to the present invention consisting of the polyamide composition above, the reflectance is high; in the light-emitting device using the reflector, the life properties are good. The reflector for a light-emitting device according to the present invention can be widely used for the LED, optical semiconductors such as the LD, and semiconductor packages such as photodiodes, CCDs, and CMOSs.

In the LED that can use the polyamide composition above as the reflector, the structure and the wavelength of the light emitted are not particularly limited. Hereinafter, using the drawings, an optical semiconductor device according to embodiments will be described. Moreover, sizes, positional relationships and the like of members shown in the drawings are exaggerated somewhat in order to clarify the description.

Figure 2:
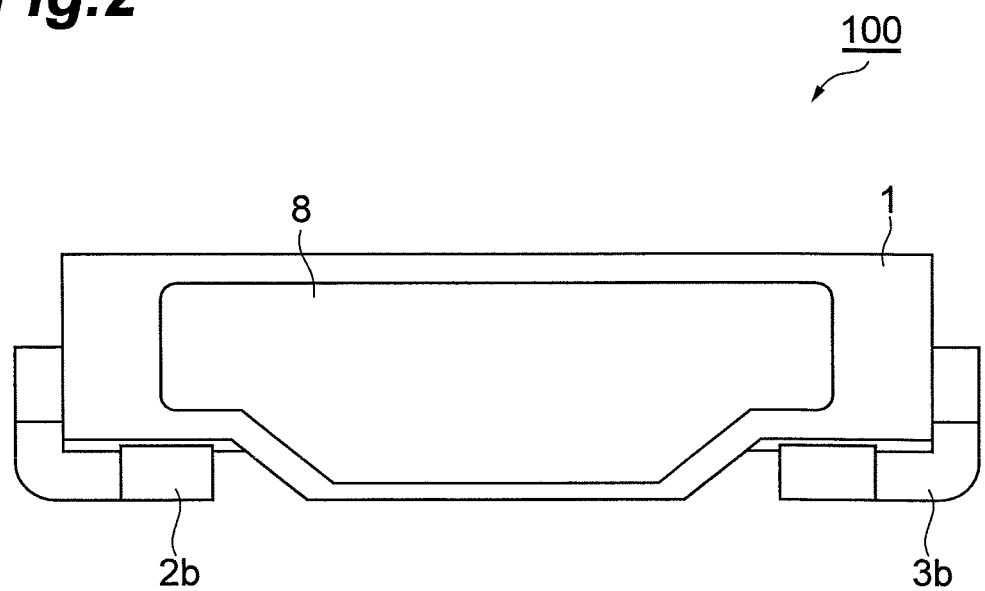
FIG. 2 is a plan view of a light-emitting device according to an embodiment.

FIG. 1 is a schematic sectional view of a light-emitting device according to an embodiment, and FIG. 2 is a plan view of the light-emitting device.

A light-emitting device 100 shown in FIGS. 1 and 2 is a surface-mount light-emitting device, and includes an optical semiconductor element 4, a package 1 on which the optical semiconductor element 4 is disposed (reflector for a light-emitting device), and an encapsulating member 8 that coats the optical semiconductor element 4. The package 1 is formed by integrally molding a base for disposing the optical semiconductor element 4 on, and a first lead electrode 2 and a second lead electrode 3 electrically connected to the optical semiconductor element 4. The package 1 has a depression having a bottom surface and a side surface; the opening of the depression is wider than the bottom surface, and the side surface is inclined. The side surface of the depression of the package 1 functions as a reflector.

Note that the optical semiconductor element 4 is fixed to the base by a die bonding member 5, and electrically connected to the first lead electrode 2 and the second lead electrode 3 via a wire 6. Moreover, in the bottom surface of the package 1, a first outer lead portion 2b and a second outer lead portion 3b are exposed.

Because the package 1 is formed using the polyamide composition above, an effect of improving the reflectance is found, and has a longer life than in the conventional reflector.

For the die bonding member 5, eutectic metals and a resin are used. Moreover, although illustration is omitted, a protection element such as a Zener diode may be disposed on another lead electrode. A silicone resin is used for the encapsulating member 8, and injected into the depression of the package. The encapsulating member 8 may comprise a fluorescent substance that absorbs the light from the optical semiconductor element 4 and converts the wavelength, or a light-diffusing substance for improving the wavelength conversion efficiency of the fluorescent substance.

The package 1 is integrally formed with a pair of lead electrodes; as another embodiment, after the package is molded, a circuit wiring is provided by plating or the like. The shape of the package 1 can be various shapes such as a flat plate shape and a cup shape as shown in FIG. 1. In the package 1, the lead electrode that supplies the current from the outside to the optical semiconductor element 4 is provided; accordingly, an insulative package whose optical resistance and heat resistance are high is suitably used.

In order to efficiently reflect the light from the optical semiconductor element 4, preferably, a white pigment and the like such as titanium oxide is mixed with the polyamide composition that forms the package 1. The number average particle diameter of the white pigment (by the electron microscopy photographing) is preferably 0.1 to 0.8 μm. Examples of a method for molding the package 1 in the case where the package 1 is molded with a resin include a method for insert molding a lead electrode that supplies the electricity to the optical semiconductor element 4 disposed on the bottom surface inside of the cup-shaped depression; other than this, the package can be relatively easily formed by injection molding, extrusion, transfer molding, and the like.

As the optical semiconductor element 4, a blue light emitting LED chip, ultraviolet light emitting LED chip, or the like including a nitride semiconductor is used. The nitride semiconductor is represented by the formula $Al_xGa_yIn_zN$, $0 \le x \le 1$, $0 \le y \le 1$, $0 \le z \le 1$, $X+Y+Z=1$); a nitride semiconductor such as InN, AlN, InGaN, AlGaN, or InGaAlN is epitaxially grown on a substrate by vapor deposition such as an MOCVD method, for example. An optical semiconductor element in which an n type semiconductor layer, a light emission layer, a p type semiconductor layer are formed in this order on the nitride semiconductor is used. For the substrate on which the nitride semiconductor is laminated, sapphire, SiC, Si, ZnO, GaN, or the like is used. Moreover, preferably, for the light emission layer, a single quantum well structure or a multi quantum well structure is used. The wavelength of the light emitted from the optical semiconductor element 4 is preferably 360 nm to 550 nm.

Moreover, as the form of mount of the optical semiconductor element 4, either of face up mount and flip chip mount can be used. Moreover, the optical semiconductor element 4 is shown in which an n-side electrode and a p-side electrode are formed on the same plane; alternatively, an optical semiconductor element 4 may be used in which using a conductive substrate for the substrate, an n-side electrode is formed on one surface of the substrate, a nitride semiconductor layer is grown on the other surface of the substrate, and a p-side electrode is formed thereon.

The first lead electrode 2 and the second lead electrode 3 are exposed in the bottom surface in the cup-shaped inside of the package 1, and electrically connected to the optical semiconductor element 4; for example, the first lead electrode 2 and the second lead electrode 3 are a plate-like lead inserted into the package 1 or a conductive pattern formed on the surface of the package 1. Accordingly, the material for the lead electrode is not particularly limited as long as the lead electrode can realize a function to be electrically connected to the optical semiconductor element 4 to be conducted; preferably, the lead electrode is formed with a material whose thermal conductivity is relatively high. Examples of the material include metals such as copper, aluminum, gold, tungsten, iron, nickel or iron-nickel alloys, and phosphor bronze or a copper-iron alloy surface treated with silver or an alloy containing silver. Alternatively, silver only, or an alloy containing silver may be used.

The encapsulating member 8 efficiently passes the light from the optical semiconductor element 4 to the outside, and protects the optical semiconductor element 4, the wire 6 and the like from an external force, dust, and the like. The encapsulating member 8 is not particularly limited; for example, the silicone resins or the epoxy resins above are used. Moreover, the encapsulating member 8 may contain a fluorescent substance, a light-diffusing member, and the like.

The fluorescent substance is not particularly limited as long as the fluorescent substance is contained in the encapsulating member 8, and absorbs the light from the optical semiconductor element 4 and converts the light to another light at a different wavelength, for example. If the fluorescent substance is contained in the encapsulating member 8, an optical semiconductor device that can emit not only the light with a wavelength emitted from the optical semiconductor element 4 but also desired light such as white light can be provided. Preferably, the fluorescent substance is, for example, at least one or more selected from nitride phosphors and oxynitride phosphors mainly activated with a lanthanoid element such as Eu and Ce; alkaline earth halogen apatite phosphors mainly activated with a lanthanoid element such as Eu or a transition metal element such as Mn; alkaline earth metal boric acid halogen phosphors; alkaline earth metal aluminate salt phosphors; alkaline earth silicic acid salt phosphors; alkaline earth sulfide phosphors; alkaline earth thiogallate phosphors; alkaline earth silicon nitride phosphors; germanate salt phosphors; rare earth element aluminate salt phosphors mainly activated with a lanthanoid element such as Ce; rare earth element silicic acid salt phosphors; organic and organic complexes mainly activated with a lanthanoid element such as Eu; or the like. Specifically, they are $(Y,Gd)_3(Al,Ga)_5O_{12}$:Ce, $(Ca,Sr,Ba)_2SiO_4$:Eu, $(Ca,Sr)_2Si_5N_8$:Eu, and $CaAlSiN_3$:Eu.

EXAMPLES

Hereinafter, the present embodiment will be more specifically described according to Examples and Comparative Examples, but the present embodiment will not be limited to these Examples.

Raw materials and measurement methods used in Examples and Comparative Examples will be shown below. Note that in the present Examples, 1 Kg/cm² means 0.098 MPa.

[Raw Material]
In the present Examples, the compounds below were used.
(A) As Polyamide
  (a) Dicarboxylic acid
    (1) 1,4-Cyclohexanedicarboxylic acid (CHDA) (trade name: 1,4-CHDA HP grade (trans isomer/cis isomer=25/75) (made by Eastman Chemical Company))
    (2) Dodecanedioic acid (C12DA) (made by Wako Pure Chemical Industries, Ltd.)
  (b) diamine
    (3) 2-Methylpentamethylenediamine (2 MPD) (made by Tokyo Chemical Industry Co., Ltd.)
(B) Titanium Oxide
  (4) $TiO_2$
    average particle size: 0.21 μm
    coating: alumina, silica, siloxane compound
    ignition loss: 1.21% by mass
(C) Amine Light Stabilizer (HALS)
trade name: Nylostab (Registered Trademark) S-EED (made by Clariant International Ltd.)
(D) Phenol Heat Stabilizer
trade name: IRGANOX (Registered Trademark) 1098 (made by Ciba, Inc.)
(E) Glass Fibers
trade name: ECS 03T-275H (made by Nippon Electric Glass Co., Ltd.) average fiber diameter of 10 μmϕ, cut length of 3 mm

[Measurement Methods]
(1) Melting points Tm1 and Tm2 (° C.)
According to JIS-K7121, measurement was performed using a Diamond-DSC made by PERKIN-ELMER Inc. The measurement condition was as follows: under a nitrogen atmosphere, a temperature at an endothermic peak (melt peak) that appeared when a temperature of approximately 10 mg of a sample was raised at a temperature raising rate of 20° C./min to 300 to 350° C. according to the melting point of the sample was Tm1 (° C.); a temperature of the highest peak of endothermic peaks (melt peaks) that appeared when a temperature was kept for 2 minutes at the highest temperature during raising the temperature in a molten state, the temperature was fallen at a temperature falling rate of 20° C./min to 30° C. to keep the temperature at 30° C. for 2 minutes, and the temperature was raised at a temperature raising rate of 20° C./min in the same manner was a melting point Tm2 (° C.); and the total peak area was the amount of heat of fusion ΔH (J/g). In the case where there were several peaks, the peak with ΔH of not less than 1 J/g was considered as the peak. For example, in the case where two peaks existed at a melting point of 295° C. and ΔH=20 J/g and a melting point of 325° C. and ΔH=5 J/g, the melting point Tm2 was 325° C., and ΔH=25 J/g.

(2) Glass Transition Temperature Tg (° C.)
According to JIS-K7121, measurement was performed using a Diamond-DSC made by PERKIN-ELMER Inc. The measurement condition was as follows: a sample was molten by a hot stage (EP80 made by Mettler-Toledo International Inc.), the obtained molten sample was quickly cooled using liquid nitrogen to solidify the sample, and used as a sample for measurement. Using 10 mg of the sample, under the condition of a temperature raising rate of 20° C./min, the temperature was raised in the range of 30 to 350° C., and the glass transition temperature was measured.

(3) Relative Viscosity at 25° C. ηr
According to JIS-K6810, the measurement was performed.
Specifically, using 98% sulfuric acid, a dissolved solution in a concentration of 1% (proportion of (1 g of polyamide)/(100 mL of 98% sulfuric acid)) was prepared, and the measurement was performed under temperature condition of 25° C.

(4) Ratio of Trans Isomer
30 to 40 mg of the polyamide was dissolved in 1.2 g of deuterated hexafluoroisopropanol, and measured by 1H-NMR. In the case of 1,4-cyclohexanedicarboxylic acid, the ratio of the trans isomer was determined from the ratio of the peak area of 1.98 ppm attributed to the trans isomer to the peak areas of 1.77 ppm and 1.86 ppm attributed to the cis isomer.

Polyamide

Production Example 1

By the "thermal melt polymerization method" described below, the polymerization reaction of the polyamide was performed. 896 g (5.20 mol) of CHDA and 604 g (5.20 mol) of 2 MPD were dissolved in 1500 g of distilled water to prepare 50% by mass of an aqueous mixed solution in which the raw material monomers were equimolar.

The obtained aqueous mixed solution and 21 g (0.18 mol) of 2 MPD as an additive during the melt polymerization were placed in an autoclave having an inner volume of 5.4 L (made by Nitto Koatsu K.K.), the temperature was kept until the temperature of the solution (inner temperature) reached 50° C., and the inside of the autoclave was purged with nitrogen. The inner pressure of a vessel of the autoclave was defined as the gauge pressure (hereinafter, any inner pressure of the vessel is written as the gauge pressure), and heating was continued until the inner pressure of the vessel reached approximately 2.5 kg/cm² (at this time, the temperature of the solution was approximately 145° C.). In order to keep the inner pressure of the vessel approximately 2.5 kg/cm², heating was continued while water was removed from the system, and the aqueous solution was condensed until the concentration of the aqueous solution reached approximately 85%. Removal of water was stopped, and heating was continued until the inner pressure of the vessel reached approximately 30 kg/cm². In order to keep the inner pressure of the autoclave approximately 30 kg/cm², until the temperature reached 300° C., heating was continued while water was removed from the system. While heating was further continued, the inner pressure of the vessel was reduced over 60 minutes from 30 kg/cm² to atmospheric pressure (gauge pressure was 0 kg/cm²). The temperature of a heater was controlled such that the final temperature of the resin (temperature of the solution) was approximately 345° C. While the temperature of the resin was kept as it was, the inside of the vessel was kept at a reduced pressure of 100 torr for 10 minutes by a vacuum apparatus. Subsequently, pressure was applied by nitrogen, and the product was formed into a strand and discharged from a lower opening (nozzle), cooled by water, cut, and discharged as pellets.

Further, the "solid phase polymerization" described below was performed.

In the melt polymerization, the obtained polyamide pellets were placed in a conical ribbon vacuum dryer (made by Okawara Mfg. Co., Ltd., a trade name Ribocone RM-10V), and purging with nitrogen was sufficiently performed. While nitrogen was flowed at 1 L/min and stirring was performed, heating was performed at 260° C. for 6 hours. Subsequently, the temperature was reduced while nitrogen was flowed; when the temperature reached approximately 50° C., the pellets were extracted from the apparatus to obtain polyamide. The obtained polyamide was dried in a nitrogen stream, and the percentage of moisture was adjusted at approximately less than 0.2% by mass; as a result of the measurement performed by the measurement method above, the melting point Tm2 was 327° C., the glass transition temperature Tg was 150° C., the ratio of the trans isomer was 71%, and the relative viscosity at 25° C. was 3.1.

Production Example 2

By the "thermal melt polymerization method" described below, the polymerization reaction of the polyamide was performed. 689 g (4.00 mol) of CHDA, 230 g (1.00 mol) of C12DA, and 581 g (5.00 mol) of 2 MPD were dissolved in 1500 g of distilled water to prepare 50% by mass of an aqueous mixed solution in which the raw material monomers were equimolar.

The obtained aqueous mixed solution and 14 g (0.12 mol) of 2 MPD as an additive during the melt polymerization were placed in an autoclave having an inner volume of 5.4 L (made by Nitto Koatsu K.K.), the temperature was kept until the temperature of the solution (inner temperature) reached 50° C., and the inside of the autoclave was purged with nitrogen. The inner pressure of a vessel of the autoclave was defined as the gauge pressure (hereinafter, any inner pressure of the autoclave is written as the gauge pressure), and heating was continued until the inner pressure of the vessel reached approximately 2.5 kg/cm² (at this time, the temperature of the solution was approximately 145° C.). In order to keep the inner pressure of the vessel approximately 2.5 kg/cm², heating was continued while water was removed from the system, and the aqueous solution was condensed until the concentration of the aqueous solution reached approximately 85%. Removal of water was stopped, and heating was continued until the inner pressure of the vessel reached approximately 30 kg/cm². In order to keep the inner pressure of the vessel approximately 30 kg/cm², until the temperature reached 255° C., heating was continued while water was removed from the system. While heating was further continued, the inner pressure of the vessel was reduced over 60 minutes from 30 kg/cm² to atmospheric pressure (gauge pressure was 0 kg/cm²). The temperature of a heater was controlled such that the final temperature of the resin (temperature of the solution) was approximately 305° C. While the temperature of the resin was kept as it was, the inside of the vessel was kept at a reduced pressure of 100 torr for 10 minutes by a vacuum apparatus. Subsequently, pressure was applied by nitrogen, and the product was formed into a strand and discharged from a lower opening (nozzle), cooled by water, cut, and discharged as pellets.

Further, the "solid phase polymerization" described below was performed.

In the melt polymerization, the obtained polyamide pellets were placed in a conical ribbon vacuum dryer (made by Okawara Mfg. Co., Ltd., a trade name Ribocone RM-10V), and purging with nitrogen was sufficiently performed. While nitrogen was flowed at 1 L/min and stirring was performed, heating was performed at 240° C. for 12 hours. Subsequently, the temperature was reduced while nitrogen was flowed; when the temperature reached approximately 50° C., the pellets were extracted from the apparatus to obtain a polyamide. The obtained polyamide was dried in a nitrogen stream, and the percentage of moisture was adjusted at approximately less than 0.2% by mass; as a result of the measurement performed by the measurement method above, the melting point Tm2 was 285° C., the glass transition temperature Tg was 125° C., the ratio of the trans isomer was 72%, and the relative viscosity at 25° C. was 3.0.

Polyamide Composition

Example 1

Using a twin-screw extruder [ZSK-26MC: Coperion GmbH (Germany)] including an upstream feeding port in a first barrel upstream of the extruder and a downstream feeding port in a ninth barrel wherein the L/D (length of the cylinder in the extruder/diameter of the cylinder in the extruder)=48 (the number of barrels: 12), a zone from the upstream feeding port to a die was set at 340° C.; at the number of rotation of the screw of 250 rpm and the amount of ejection of 25 kg/h, the polyamide produced in Production Example 1 (70 parts by mass), titanium oxide (20 parts by mass), the amine light stabilizer (0.3 parts by mass), and the phenol heat stabilizer (0.3 parts by mass) were dry blended and fed from the upstream feeding port, and the glass fibers (10 parts by mass) were fed from the downstream feeding port; the mixture was melt kneaded to produce polyamide composition pellets. The obtained polyamide composition was dried in a nitrogen stream to reduce moisture to not more than 500 ppm, and molded, and a variety of evaluations were performed.

Example 2

Using a twin-screw extruder [ZSK-26MC: Coperion GmbH (Germany)] including an upstream feeding port in a first barrel upstream of the extruder and a downstream feeding port in a ninth barrel wherein the L/D (length of the cylinder in the extruder/diameter of the cylinder in the extruder)=48 (the number of barrels: 12), a zone from the upstream feeding port to a die was set at 320° C.; at the number of rotation of the screw of 250 rpm and the amount of ejection of 25 kg/h, the polyamide produced in Production Example 2 (70 parts by mass), titanium oxide (20 parts by mass), the amine light stabilizer (0.3 parts by mass), and the phenol heat stabilizer (0.3 parts by mass) were dry blended and fed from the upstream feeding port, and the glass fibers (10 parts by mass) were fed from the downstream feeding port; the mixture was melt kneaded to produce polyamide composition pellets. The obtained polyamide composition was dried in a nitrogen stream to reduce moisture to not more than 500 ppm, and molded, and a variety of evaluations were performed.

Comparative Example 1

The AMODEL (Registered Trademark) A-4422 LS WH118 (made by Solvay Advanced Polymers, L.L.C.) was molded, and a variety of evaluations were performed. The AMODEL is polyphthalamide (aromatic polyamide).

[Measurement of Reflectance]

Next, the reflectance of the polyamide composition used for a member for the package was measured. First, a 2-cm square plate like molded product of the polyamide composition was prepared. Here, as the polyamide composition whose reflectance was measured, the polyamide composition according to Example 1 was used. A high speed spectrophotometer: CMS-35SP was used as a reflectance measuring apparatus, and the measurement was performed using a D65 light source. As a result, the initial reflectance of the polyamide composition according to Example 1 was 91.3% to the light at 450 nm. Moreover, also in the polyamide composition according to Example 2, the same molded product was prepared, and the reflectance was measured using the same measurement condition and the same measurement apparatus. The initial reflectance of the polyamide composition according to Example 2 was 92.9% to the light at 450 nm. Moreover, the molded product of the composition according to Comparative Example 1 was prepared, and the reflectance was measured using the same measurement condition and the same measurement apparatus; as a result, the initial reflectance was 87.7%.

From the difference in the initial reflectance, in the case where the luminance of the package using the composition according to Comparative Example 1 was 1.00 (100%), the luminance of the package using the polyamide composition according to Example 1 was 1.10 (110%), and the luminance is 10% improved. Moreover, the luminance of the package using the polyamide composition according to Example 2 is 13% improved than the luminance of the package using the composition according to Comparative Example 1.

TABLE 1

| Composition | Initial reflectance (%) | Relative luminance (%) |
|---|---|---|
| Example 1 | 91.3 | 110 |
| Example 2 | 92.9 | 113 |
| Comparative Example 1 | 87.7 | 100 |

[Optical Resistance Test]

After the initial reflectance was measured, the 2-cm square plate-like molded product of the polyamide composition was placed in an optical resistance tester made by Daipla Wintes Co., Ltd. As the optical resistance test condition, on an irradiation condition of 16 mW/cm² and at an environmental temperature of 120° C., the test was performed. The reflectance of the polyamide composition according to Example 1 after the polyamide composition was placed in the optical resistance tester for 300 hours was 85.6%. From the result of the reflectance, the reflectance retention rate to the light at 450 nm after 300 hours was calculated; as a result, the reflectance retention rate was 93.7% in the case of using the polyamide composition according to Example 1.

Moreover, also in the polyamide composition according to Example 2, after the initial reflectance was measured, a 2-cm square plate-like molded product was prepared; performing the same optical resistance test condition, the reflectance after 300 hours passed was measured. As a result, the reflectance after 300 hours was 79.3%. From the value of the reflectance, the reflectance retention rate was 85.3%.

On the other hand, the molded product of the composition according to Comparative Example 1 was placed in the optical resistance tester, and the reflectance was measured on the same measurement condition; as a result, the reflectance after 300 hours was 71.2%. From the value of the reflectance, the reflectance retention rate was calculated; as a result, the reflectance retention rate was 81.2%. Here, the reflectance retention rate is a rate obtained by calculating a degree of the reflectance to be kept after the optical resistance test is performed for 300 hours wherein the initial reflectance before the test is 100%.

TABLE 2

| Composition | Reflectance after 300 hours (%) | Reflectance retention rate (%) |
|---|---|---|
| Example 1 | 85.6 | 93.7 |
| Example 2 | 79.3 | 85.3 |
| Comparative Example 1 | 71.2 | 81.2 |

Example 3

In Example 3, a light-emitting device shown in FIG. 1 and FIG. 2 was produced. The configurations in FIG. 1 and FIG. 2 are as described above.

As the optical semiconductor element 4, a blue light emitting GaN semiconductor was used. The optical semiconductor element 4 has the first electrode and the second electrode on the same surface side; the optical semiconductor element 4 was face-up bonded to the base using the die bonding member 5 (die bonding resin). The first electrode of the optical semiconductor element 4 was electrically connected to the first lead electrode 2 using a gold wire 6, and the second electrode was also electrically connected to the second lead electrode 3 using a gold wire. In the base, the first lead electrode 2, and the second lead electrode 3, copper was used as the mother material, and silver plating was applied. As the base, the first lead electrode 2, and the second lead electrode 3, those having approximately 0.15 mm were used. The polyamide composition according to Example 1 was used for the package 1, and a silicone resin was used for the encapsulating member 8. A YAG phosphor having the composition of $(Y_{0.8}Gd_{0.2})_3Al_5O_{12}$:Ce was uniformly mixed with the encapsulating member 8. The encapsulating member 8 was disposed on the bottom surface and the side surface of the depression of the package 1, and the surface of the encapsulating member 8 was approximately matched with the top surface of the depression of the package 1.

The light-emitting device according to Example 3 was produced according to the following step.

FIGS. 3(a) to 3(d) are schematic sectional views showing a step of molding the package 1 according to the present Example. Hereinafter, a method for molding a package according to the present invention will be described as (a) to (d) in order.

First, (a) a lead frame 24 formed by punching a metal flat plate is held by a pair of molds of a projection mold 27 and a depression mold 28 to dispose the lead frame 24 within a hollow portion formed by the inner wall surfaces of the projection mold 27 and the depression mold 28. At this time, the lead frame 24 is disposed such that the tips of the lead frames 24 formed as a pair of positive and negative lead electrodes 2 and 3 at a subsequent step face each other at a predetermined interval. Note that the projection mold 27 has at least one or more stick-like extruding members 25 (for example, a pin) inserted into a through hole, and can be moved in the direction of the hollow portion and the depression mold 28 above. Next, (b) a package molding material 26 is injected to a gate provided in the above hollow portion in the depression mold 28 to fill the inside of the above hollow portion with the package molding material 26 (polyamide composition).

Figure 3:
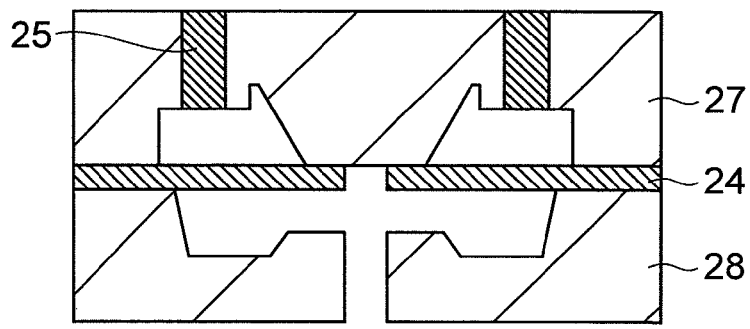
FIG. 3 is a schematic sectional view showing a step of molding a package.
Figure 3:
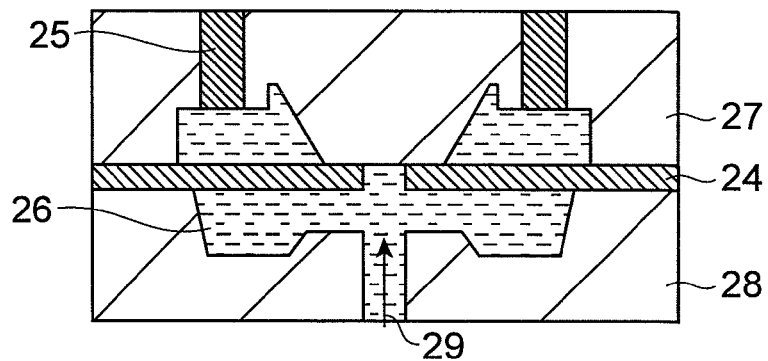
Figure 3:
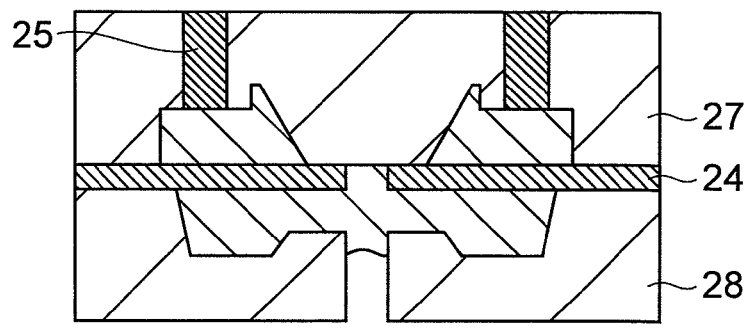
Figure 3:
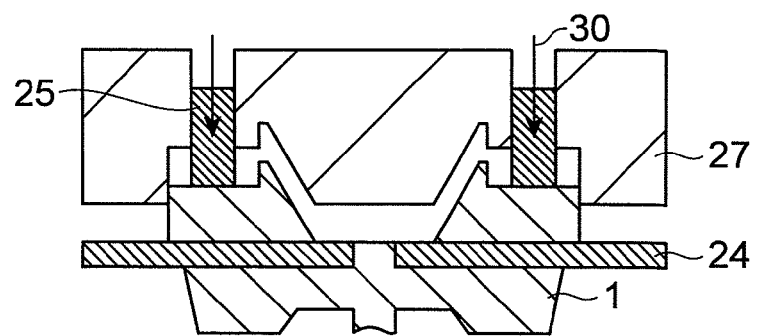

Note that the injection direction of the package molding material is shown as the arrow of the package molding material injection direction 29 in FIG. 3(b). Moreover, at the time of injecting the package molding material 26, as shown in FIG. 3(b), the bottom surface of the extruding member 25 may be disposed so as to be approximately on the same surface as the inner wall surface of the projection mold 27; alternatively, the bottom surface of the extruding member 25 may be disposed so as to project to some extent in the direction of the depression mold 28. (c) The molding material filled into the hollow portion above is heated and cooled to cure the molding material. (d) First, the depression mold 28 is removed, and the bottom surface of the extruding member 25 is pressed against the top surface of the package to move the extruding member 25 in the direction of the depression mold 28; thereby, the package 1 is removed from the inside of the projection mold 27. Note that the moving direction of the extruding member 25 is shown as the arrow of an extruding direction 30 in FIG. 3(d).

As described above, as the package 1 used in the light-emitting device according to the present embodiment, the package 1 formed by injection molding using a mold is formed within the mold, and extruded by the extruding member 25 such as a pin provided within the mold to be removed from the mold.

The package 1 according to the present Example has the depression that can accommodate the optical semiconductor element 4. The shape of the inner wall surface that forms the depression is a tapered shape such that the inner diameter is gradually increased toward the opening side, and the region of the tapered shape serves as the reflector for a light-emitting device. Thereby, the light emitted from the end surface of the optical semiconductor element 4 can be efficiently extracted in the direction of the light emission observation. Alternatively, in order to enhance reflection of the light, the inner wall surface of the depression may have a light reflecting function, for example, the inner wall surface of the depression is plated with a metal such as silver.

In the light-emitting device according to the present Example, the optical semiconductor element 4 is disposed within the depression of the package 1 thus configured, and a silicone resin is filled so as to coat the optical semiconductor element 4 within the depression to form the encapsulating member 8.

Next, the optical semiconductor element 4 is die bonded to the bottom surface of the depression. The first electrode of the optical semiconductor element 4 and an inner lead portion of the first lead electrode 2 are electrically connected to each other using a wire. Moreover, the second electrode of the optical semiconductor element 4 and an inner lead portion of the second lead electrode 3 are electrically connected to each other using a wire.

Next, a silicone resin corresponding to the encapsulating member 8, in which a YAG phosphor is uniformly mixed as a phosphor, is dropped to the top surface of the depression of the package 1. Because of the viscosity of the silicone resin and the like, the YAG phosphor is sedimented. The YAG phosphor is sedimented; thereby, the YAG phosphor can be disposed around the optical semiconductor element 4, and a light-emitting device having a predetermined color tone can be provided. After the silicone resin is dropped, the silicone resin is cured to form the encapsulating member 8.

Finally, the lead frame is cut out at a predetermined position to form the first outer lead portion 2b and the second outer lead portion 3b. Thereby, the light-emitting device according to Example 1 can be produced.

[Life Test]

Using a commercially available side-view light-emitting device (made by Nichia Corporation, NSSW108 (product number)) that is the light-emitting device shown in Example 3, a life test was performed. The light-emitting device has a shape of a length of 2.8 mm×a width of 1.2 mm×a height of 0.8 mm.

Life Test 1

In the life test 1, under the condition of an atmosphere temperature of 60° C. and an applied current of 30 mA, the output (Po) retention rate of the light-emitting device according to Example 3 and that of a light-emitting device using the composition according to Comparative Example 1 for the package (hereinafter, Comparative Example 2) were measured. The output retention rate after 3000 hours passed was 75% in Example 3, while it is significantly reduced to 60% in Comparative Example 2.

TABLE 3

| Light-emitting device | After 1000 hours passed (%) | After 2000 hours passed (%) | After 3000 hours passed (%) |
| --- | --- | --- | --- |
| Example 3 | 96 | 86 | 75 |
| Comparative Example 2 | 92 | 75 | 60 |

Life Test 2

In the life test 2, under the condition of an atmosphere temperature of 85° C., a humidity of 85%, and an applied current of 10 mA, the output (Po) retention rate of the light-emitting device according to Example 3 and that of the light-emitting device according to Comparative Example 2 are measured. The output retention rate after 3000 hours passed was 90% in Example 3 while it is reduced to 80% in Comparative Example 2.

TABLE 4

| Light-emitting device | After 1000 hours passed (%) | After 2000 hours passed (%) | After 3000 hours passed (%) |
| --- | --- | --- | --- |
| Example 3 | 97 | 93 | 90 |
| Comparative Example 2 | 95 | 88 | 80 |

INDUSTRIAL APPLICABILITY

A polyamide composition consisting of a polyamide polymerized from (a) a dicarboxylic acid comprising at least 50 mol % of an alicyclic dicarboxylic acid, and a (b) diamine comprising at least 50 mol % of a diamine with a branched main chain is useful as a reflector for a variety of optical semiconductor elements such as light-receiving elements, photodiodes, phototransistors, photosensors, and laser diodes. Moreover, the reflector can be used for the light-emitting device used for backlights of liquid crystal displays, panel meters, indicator lamps, surface light emitting switches, and the like.

REFERENCE SIGNS LIST

1 . . . Package, 2 . . . First lead electrode, 3 . . . Second lead electrode, 2b . . . First outer lead portion, 3b . . . Second outer lead portion, 4 . . . Optical semiconductor element, 5 . . . Die bonding member, 6 . . . Wire, 8 . . . Encapsulating member, 24 . . . Lead frame, 25 . . . Extruding member, 26 . . . Package molding material, 27 . . . Projection mold, 28 . . . Depression mold, 29 . . . Package molding material injection direction, 30 . . . Extruding direction, 100 . . . Light-emitting device.

The invention claimed is:

1. A reflector for a light-emitting device consisting of a polyamide composition comprising (A) a polyamide polymerized from (a) a dicarboxylic acid comprising at least 50 mol % of 1,4-cyclohexanedicarboxylic acid and (b) a diamine comprising at least 50 mol % of diamine with a branched main chain, wherein the glass transition temperature of the polyamide is not less than 110° C., and wherein when the amount of 1,4-cyclohexanedicarboxylic acid is less than 80 mol % of the dicarboxylic acid, at least 20 mol % of an aliphatic dicarboxylic acid is also present.

2. The reflector for a light-emitting device according to claim 1, wherein the diamine with a branched main chain is 2-methylpentamethylenediamine.

3. The reflector for a light-emitting device according to claim 1, wherein a melting point of (A) the polyamide is 270 to 350° C.

4. The reflector for a light-emitting device according to claim 1, wherein the trans isomer content in (A) the polyamide is 50 to 85 mol %.

5. The reflector for a light-emitting device according to claim 1, wherein the polyamide composition comprises (B) a white pigment.

6. The reflector for a light-emitting device according to claim 5, wherein (B) the white pigment comprises titanium oxide having a number average particle diameter of 0.1 to 0.8 μm.

7. The reflector for a light-emitting device according to claim 6, wherein (B) the titanium oxide is subjected to inorganic coating and/or organic coating.

8. The reflector for a light-emitting device according to claim 6, wherein an ignition loss of (B) the titanium oxide is 0.7 to 2.5% by mass.

9. The reflector for a light-emitting device according to claim 1, wherein the polyamide composition comprises (C) an amine light stabilizer.

10. The reflector for a light-emitting device according to claim 1, wherein the polyamide composition comprises (D) a phenol heat stabilizer.

11. The reflector for a light-emitting device according to claim 1, wherein the polyamide composition comprises one or more inorganic fillers selected from the group consisting of (E) glass fibers, potassium titanate fibers, talc, wollastonite, kaolin, mica, calcium carbonate, and clay.

12. A light-emitting device comprising the reflector for a light-emitting device according to claim 1.

13. A reflector for a light-emitting device consisting of a polyamide composition comprising:

(A) 55 to 95% by mass of a polyamide polymerized from (a) a dicarboxylic acid comprising at least 50 mol % of 1,4-cyclohexane dicarboxylic acid and (b) a diamine comprising at least 50 mol % of a diamine with a branched main chain, wherein the glass transition temperature of the polyamide is not less than 110° C., and wherein when the amount of 1,4-cyclohexanedicarboxylic acid is less than 80 mol % of the dicarboxylic acid, at least 20 mol % of an aliphatic dicarboxylic acid is also present, (B) 5 to 45% by mass of titanium oxide, (C) 0 to 1% by mass of an amine light stabilizer, (D) 0 to 1% by mass of a phenol heat stabilizer, and (E) 0 to 25% by mass of an inorganic filling material based on the whole mass.

* * * * *